United States Patent
Hanamachi et al.

(10) Patent No.: US 11,490,464 B2
(45) Date of Patent: *Nov. 1, 2022

(54) HEATER UNIT

(71) Applicant: NHK SPRING CO., LTD., Kanagawa (JP)

(72) Inventors: Toshihiko Hanamachi, Kanagawa (JP); Kenji Sekiya, Kanagawa (JP); Go Takahara, Kanagawa (JP); Naoya Aikawa, Kanagawa (JP); Yuta Kisara, Kanagawa (JP); Arata Tatsumi, Kanagawa (JP)

(73) Assignee: NHK SPRING CO., LTD., Yokohama (JP)

( * ) Notice: Subject to any disclaimer, the term of this patent is extended or adjusted under 35 U.S.C. 154(b) by 255 days.

This patent is subject to a terminal disclaimer.

(21) Appl. No.: 16/598,100

(22) Filed: Oct. 10, 2019

(65) Prior Publication Data

US 2020/0043638 A1 Feb. 6, 2020

Related U.S. Application Data

(63) Continuation of application No. PCT/JP2018/014245, filed on Apr. 3, 2018.

(30) Foreign Application Priority Data

Apr. 12, 2017 (JP) .............................. JP2017-078950

(51) Int. Cl.
*H05B 3/18* (2006.01)
*H05B 3/28* (2006.01)
(Continued)

(52) U.S. Cl.
CPC ................. *H05B 3/48* (2013.01); *H01C 1/03* (2013.01); *H05B 3/10* (2013.01); *H05B 3/18* (2013.01);
(Continued)

(58) Field of Classification Search
None
See application file for complete search history.

(56) References Cited

U.S. PATENT DOCUMENTS

| | | | |
|---|---|---|---|
| 5,844,205 A | 12/1998 | White et al. | |
| 6,035,101 A | * 3/2000 | Sajoto | .................... C23C 16/46 |
| | | | 392/416 |

(Continued)

FOREIGN PATENT DOCUMENTS

| | | |
|---|---|---|
| CN | 201319673 Y | 9/2009 |
| CN | 201766729 U | 3/2011 |

(Continued)

OTHER PUBLICATIONS

JPH-06333666A, Soeda et al, Feb. 1999, "Sheath Heater," partial translation, same as JP-2857966 B2. (Year: 1999).*

(Continued)

*Primary Examiner* — Joseph M. Pelham
(74) *Attorney, Agent, or Firm* — Hauptman Ham, LLP

(57) ABSTRACT

A heather unit including a small diameter sheath heater with improved reliability is provided. The heater unit includes a first substrate having a first joint surface and a second substrate having a second joint surface being joined together, a groove arranged on at least one of the first joint surface or the second joint surface, and a sheath heater arranged inside the groove. The sheath heater includes a metal sheath, a heating wire having a band shape, the heating wire arranged with a space within the metal sheath so as to rotate with respect to an axis direction of the metal sheath, an insulating material arranged in the space, and connection terminals arranged at one end of the metal sheath, the connection terminals electrically connected with both ends of the heating wire respectively.

10 Claims, 14 Drawing Sheets

(51) Int. Cl.
*H05B 3/30* (2006.01)
*H05B 3/48* (2006.01)
*H01C 1/03* (2006.01)
*H05B 3/10* (2006.01)
*H01L 21/67* (2006.01)

(52) U.S. Cl.
CPC ........ *H05B 3/283* (2013.01); *H01L 21/67103* (2013.01); *H05B 2203/014* (2013.01)

(56) References Cited

U.S. PATENT DOCUMENTS

| | | | | |
|---|---|---|---|---|
| 6,160,244 | A * | 12/2000 | Ohashi | H01L 21/67103 219/444.1 |
| 6,180,931 | B1 * | 1/2001 | Futakuchiya | H01L 21/67103 219/544 |
| 8,447,177 | B2 * | 5/2013 | Kusuda | H01L 21/68742 392/418 |
| 2001/0016115 | A1 | 8/2001 | Hirata et al. | |
| 2007/0257023 | A1 * | 11/2007 | Watanabe | H01L 21/67103 219/444.1 |
| 2008/0197125 | A1 * | 8/2008 | Cui | H01L 21/67103 219/548 |
| 2008/0230535 | A1 * | 9/2008 | Huang | H01L 21/67126 219/444.1 |
| 2013/0313246 | A1 | 11/2013 | Long et al. | |
| 2015/0114949 | A1 | 4/2015 | Lee | |
| 2016/0278164 | A1 | 9/2016 | Iida et al. | |
| 2017/0071033 | A1 * | 3/2017 | Schlipf | H05B 1/0297 |
| 2020/0043638 | A1 * | 2/2020 | Hanamachi | H01L 21/68792 |
| 2020/0045779 | A1 * | 2/2020 | Hanamachi | H05B 3/48 |
| 2021/0112632 | A1 * | 4/2021 | Schlipf | H05B 3/40 |
| 2021/0217638 | A1 * | 7/2021 | Hanamachi | C23C 14/50 |
| 2021/0235550 | A1 * | 7/2021 | Hanamachi | C23C 14/50 |
| 2021/0243849 | A1 * | 8/2021 | Boiger | C04B 33/26 |

FOREIGN PATENT DOCUMENTS

| | | | |
|---|---|---|---|
| CN | 103096537 A | 5/2013 | |
| CN | 103179703 A | 6/2013 | |
| CN | 105594299 A | 5/2016 | |
| GB | 363975 A | 12/1931 | |
| GB | 2537715 A * | 10/2016 | ........... F24H 1/0018 |
| JP | S39-022480 | 8/1964 | |
| JP | S48-032038 | 10/1973 | |
| JP | S51-088853 | 1/1975 | |
| JP | S52-161342 U | 12/1977 | |
| JP | S54-086756 A | 12/1977 | |
| JP | S54-126146 A | 2/1978 | |
| JP | S58-054517 A | 3/1983 | |
| JP | S58-54577 A | 3/1983 | |
| JP | 2710043 B2 | 2/1998 | |
| JP | H06333666 A * | 2/1999 | |
| JP | 2002-151239 A | 5/2002 | |
| JP | 2009-091660 A | 4/2009 | |
| JP | 2011-253692 A | 12/2011 | |
| JP | 5095349 B2 | 12/2012 | |
| JP | 2020047405 A * | 3/2020 | |
| KR | 10-0702756 B1 | 4/2007 | |
| KR | 10-0900001 B1 | 5/2009 | |
| KR | 10-2010-0080765 A | 7/2010 | |
| TW | 201448658 A | 12/2014 | |

OTHER PUBLICATIONS

JPH-06333666A, Soeda et al, Feb. 1999, "Sheath Heater," Bibliographic data, same as JP-2857966 B2. (Year: 1999).*
Office Action issued for corresponding Chinese Patent Application No. 201880024404.0 dated Apr. 21, 2021, along with an English machine translation.
Office Action issued for corresponding Chinese Patent Application No. 201880024287.8 dated Apr. 21, 2021, along with an English machine translation.
Office Action issued for corresponding Korean Patent Application No. 10-2019-7030539 dated Jul. 16, 2020, along with an English machine translation.
Office Action issued for corresponding Korean Patent Application No. 10-2019-7030535 dated Jul. 16, 2020, along with an English machine translation.
Office Action issued for corresponding Japanese Patent Application No. 2017-078950 dated Jan. 26, 2021, along with an English machine translation.
Extended European Search Report issued for corresponding European Patent Application No. 18784228.1 dated Nov. 16, 2020.
Extended European Search Report issued for corresponding European Patent Application No. 18785237.1 dated Dec. 14, 2020.
Office Action issued for Japanese Patent Application No. 2017-078969 dated Jan. 5, 2021, along with an English machine translation.
International Search Report (PCT/ISA/210) dated Jun. 26, 2018 for the PCT application No. PCT/JP2018/014245 with English translation.
Written Opinion of the International Searching Authority (PCT/ISA/237) dated Jun. 26, 2018 for the PCT application No. PCT/JP2018/014245 with English translation.
International Search Report (PCT/ISA/210) dated Jun. 19, 2018 for the copending PCT application No. PCT/JP2018/014259 with English translation.
Written Opinion of the International Searching Authority (PCT/ISA/237) dated Jun. 19, 2018 for the copending PCT application No. PCT/JP2018/014259 with English translation.
Taiwanese Office Action dated Apr. 16, 2019 for the copending TW application No. 107112410 with partial English translation.
Taiwanese Office Action dated Apr. 15, 2019 for the corresponding TW application No. 107111615 with partial English translation.
Office Action dated Dec. 13, 2021 for corresponding Chinese Patent Application No. 201880024404.0, along with an English machine translation.
Office Action dated Dec. 13, 2021 for corresponding Chinese Patent Application No. 201880024287.8, along with an English machine translation.
Office Action dated Sep. 15, 2021 for co-pending U.S. Appl. No. 16/653,094.
Supplemental Office Action dated Sep. 23, 2021 for co-pending U.S. Appl. No. 16/653,094.
Official Action dated Jun. 30, 2022, for European Patent Application No. 18784228.1.
Notice of Allowance dated Aug. 15, 2022, for co-pending U.S. Appl. No. 16/653,094.

* cited by examiner

HEATER UNIT

CROSS REFERENCE TO RELATED APPLICATIONS

This application is based upon and claims the benefit of priority from the prior Japanese Patent Application No. 2017-078950 filed on Apr. 12, 2017. Further, this application is a continuation Application of International Application No. PCT/JP2018/014245, filed on Apr. 3, 2018. Both of the priority documents are hereby incorporated by reference.

FIELD

The present invention is related to a heater unit. In particular, the present invention is related to a heater unit mounted with a sheath heater used in a manufacturing process of a semiconductor device.

BACKGROUND

Semiconductor devices are mounted in almost all electronic devices and play an important role in the functions of electronic devices. In the manufacturing process of a semiconductor device, a functional element such as a transistor element, wiring, a resistor element or a capacitor element is formed by film formation and processing of a thin film on a semiconductor substrate. A chemical vapor deposition (CVD) method, a physical vapor deposition (PVD) method, or an atomic layer deposition (ALD) method and the like are used as a method for forming a thin film on a semiconductor substrate. In addition, a method such as a reactive ion etching (RIE) method, a mechanical polishing (MP) or a chemical mechanical polishing (CMP) is used as a method for processing the thin film. In addition, in the manufacturing process of the semiconductor device, a surface treatment process such as a plasma treatment is performed in addition to thin film formation and processing.

In the film formation, processing and surface treatment processes described above, many reaction conditions determine the properties of the thin film and one of these conditions is the temperature of the semiconductor substrate. In many cases, the temperature of the semiconductor substrate is controlled by adjusting the temperature of a mounting table (referred to as "stage" herein) on which the semiconductor substrate is set. In order to adjust the temperature of the stage, a sheath heater, which is a heating mechanism, is embedded in the stage in a meandering or spiral shape.

For example, a sheath heater arranged with a plurality of heating lines in a single metal tube shaped sheath is disclosed in Japanese Patent Application Publication No. 2002-151239. Usually, heating is performed using one of a plurality of heating wires, and when this heating wire is disconnected, the power supply circuit is switched to another heating wire to recover easily and quickly.

SUMMARY

According to one embodiment of the present invention, a heater unit is provided including a first substrate having a first joint surface and a second substrate having a second joint surface being joined together, a groove arranged on at least one of the first joint surface or the second joint surface, and a sheath heater arranged inside the groove. The sheath heater includes, a metal sheath, a heating wire having a band shape, the heating wire arranged with a space within the metal sheath so as to rotate with respect to an axis direction of the metal sheath, an insulating material arranged in the space, and connection terminals arranged at one end of the metal sheath, the connection terminals electrically connected with both ends of the heating wire respectively.

DESCRIPTION OF EMBODIMENTS

Figure 1:
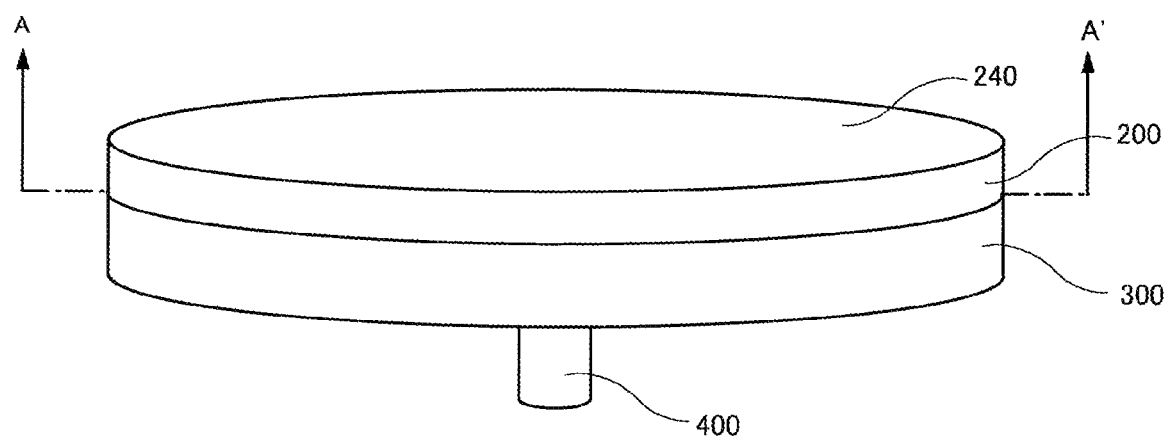
FIG. 1 is a perspective diagram showing a structure of a heater unit according to one embodiment of the present invention.

The sheath heater described in Japanese Patent Application Publication No. 2002-151239 assumes that stainless steel is used for the metal sheath and nickel-chromium alloy is used for the heating wire. Since the difference in thermal expansion is small, no consideration has been made regarding the suppression of a disconnection of the heating wire.

One of the objects of an embodiments of the present invention is to provide a heater unit including a small diameter sheath heater with improved reliability.

Hereinafter, each embodiment of the invention disclosed in the present application is explained below while referring to the drawings. However, the present invention can be implemented in various forms without departing from the gist of the invention and should not be construed as being limited to the description of the embodiments exemplified below.

In addition, although the drawings may be schematically represented with respect to the width, thickness, shape, or the like of each part as compared with the actual embodiment in order to make the explanation clearer, they are merely examples, and do not limit an interpretation of the present invention. In addition, in the present specification and each drawing, elements which have the same functions as those described with reference to previous drawings may be denoted by the same reference numerals and overlapping explanations may be omitted. For convenience of explanation, although the terms "upper" or "lower" are used, upper or lower indicates the direction when the heater unit is used (when the substrate is set).

First Embodiment

Figure 2:
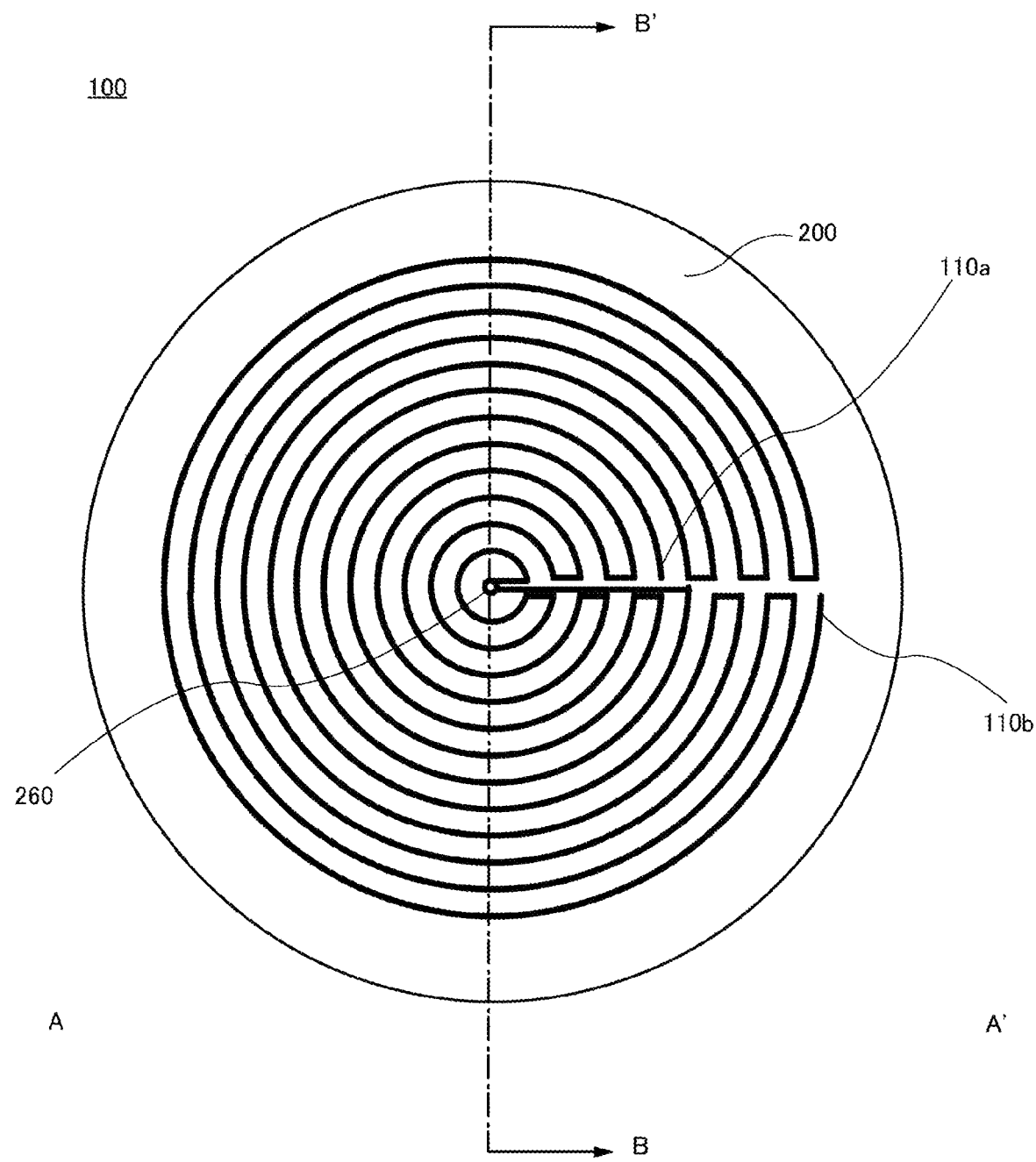
FIG. 2 is a cross-sectional diagram showing a structure of a heater unit according to one embodiment of the present invention.
Figure 3:
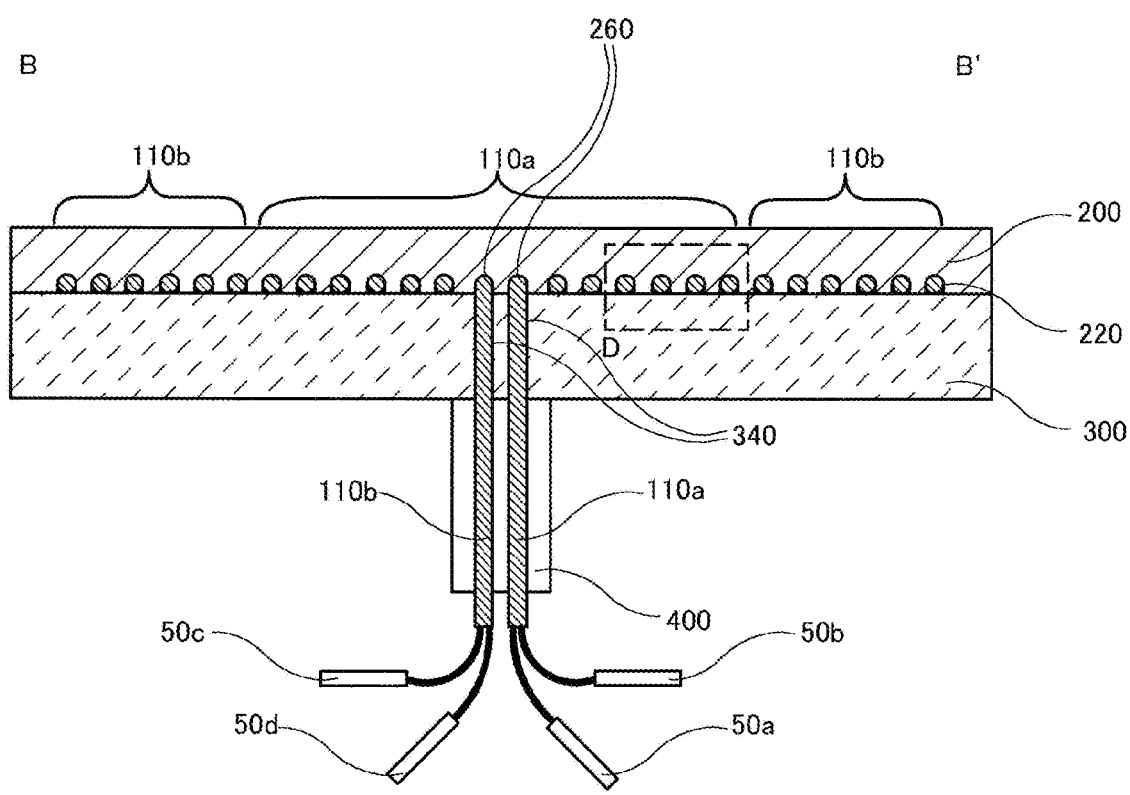
FIG. 3 is a cross-sectional diagram showing a structure of a heater unit according to one embodiment of the present invention.

The overall structure of the heater unit according to the first embodiment of the present invention is explained using FIG. 1 to FIG. 3. The heater unit according to the first embodiment of the present invention has a heating mechanism. In addition, the heater unit according to the first embodiment can be used in a CVD device, a sputtering device, a vapor deposition device, an etching device, a plasma processing device, a measurement device, an inspection device, and a microscope and the like. However, the heater unit according to the first embodiment is not limited to being used in the devices described above and can be used for a device which requires a substrate to be heated.

[Structure of Heater Unit 100]

FIG. 1 is a perspective diagram showing a structure of a heater unit according to one embodiment of the present invention. FIG. 2 is a cross-sectional diagram along the line A-A' in FIG. 1. FIG. 3 is a cross-sectional diagram along the line B-B' in FIG. 2. As is shown in FIG. 1 to FIG. 3, the heater unit 100 according to the first embodiment includes a first substrate 200, a second substrate 300, a shaft 400 and a sheath heater 110.

Referring to FIG. 1 to FIG. 3, the first substrate 200 which has a flat upper surface and grooves 220 on a lower surface is joined to the second substrate 300, and thereby the sheath heater 110 is embedded in the groove 220 on the join surface of the first substrate 200 and second substrate 300. The upper surface of the first substrate 200 is a stage 240 for mounting a substrate. A substrate is set on the stage 240. That is, the sheath heater 110 heats a substrate on the stage 240 through the first substrate 200.

The sheath heater 110 includes a first sheath heater 110a and a second sheath heater 110b which are each controlled independently. Here, when the first sheath heater 110a and the second sheath heater 110b are not particularly distinguished, they are referred to as the sheath heater 110. In the present embodiment, a structure is shown in which the two sheath heaters 110 form patterns in each corresponding region on a join surface of the first substrate 200 and the second substrate 300. However, the present invention is not limited to this structure, and the number of sheath heaters 110 which are arranged on the joint surface of the first substrate 200 and the second substrate 300 may be one or more and can be appropriately set. As the number of sheath heaters 110 arranged on the join surface of the first substrate 200 and the second substrate 300 increases, it is possible to perform precise control so that the temperature distribution of the stage 240 can be restricted.

In the present embodiment, the first sheath heater 110a and the second sheath heater 110b showing the configuration of a circular pattern in the join surface of the first substrate 200 and the second substrate 300. However, the present embodiment is not limited to this configuration, and the pattern shape of the sheath heater 110 formed on the join surfaces of the first substrate 200 and the second substrate 300 can be designed as appropriate. For example, the pattern shape of the sheath heater 110 may be a rectangle or a polygon. In addition, although a configuration is shown in which the second sheath heater 110b surrounds the first sheath heater 110a, the configuration is not limited to this. A plurality of regions in which each sheath heater 110 is arranged may be divided into various shapes other than those described above. For example, the plurality of regions may be regions which are divided into a sector shape based on the centers of the join surfaces of the first substrate 200 and the second substrate 300. By including a structure described herein, the sheath heater 110 according to the present embodiment can be bent into a complicated shape, and a fine pattern shaped layout can be formed on the join surface of the first substrate 200 and the second substrate 300. The finer the pattern of the sheath heater 110 which is arranged on the join surface of the first substrate 200 and the second substrate 300, the more precisely control can be performed in order to restrict the temperature distribution of the stage 240.

Figure 4A:
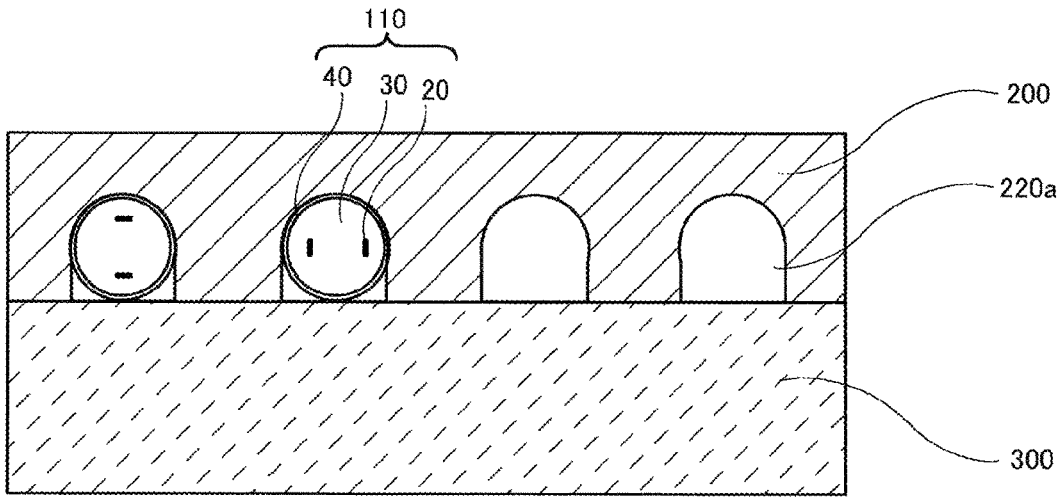
FIG. 4A is an expanded cross-sectional diagram of a heater unit according to one embodiment of the present invention.

The sheath heater 110 in the present embodiment is arranged in a groove 220 on the lower surface of the first substrate 200 (surface opposite to the stage 240, and the join surface of the first substrate 200 and the second substrate 300). FIG. 4A is an enlarged cross-sectional diagram in a region D of FIG. 3. Here, the sheath heater 110 is not shown in the two right grooves 220 in FIG. 4A to FIG. 4C so that the shape of the groove 220 can be understood. As is shown in FIG. 4A, the groove 220a arranged with the sheath heater 110 is a recess part which includes an open end on the lower surface side of the first substrate 200 and a round bottom part on the upper surface side of the first substrate 200. For example, in the case when the outer diameter of the sheath heater 110 is 4.5 mm, the depth of the groove 220a arranged with the sheath heater 110 is 4.3 mm or more and 4.5 mm or less from the lower surface of the first substrate 200. The width of the groove 220a arranged with the sheath heater 110 is 4.5 mm or more and 5.0 mm or less. By setting the shape and size of the groove 220a arranged with the sheath heater 110 close to the shape and size of the sheath heater 110, the contact area between the sheath heater 110 and the first substrate 200 can be increased, and the thermal energy generated by the sheath heater 110 to the first substrate 200 can be efficiently transmitted.

Figure 4B:
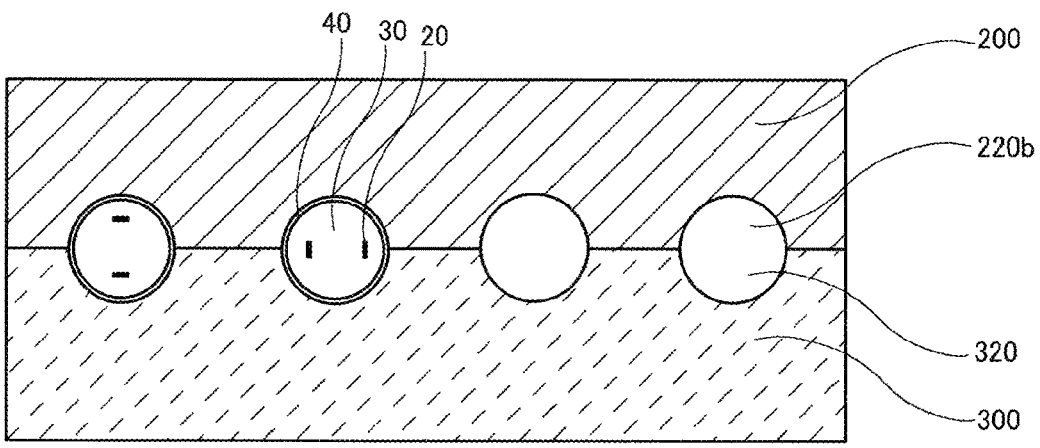
FIG. 4B is an expanded cross-sectional diagram of a heater unit according to one embodiment of the present invention.

However, the present invention is not limited to this structure, and the shape and size of the groove arranged with the sheath heater can be appropriately designed according to the shape and size of the sheath heater 110. For example, as is shown in FIG. 4B, the groove arranged with the sheath heater 110 may have a combination of a recess part (the groove 220b) including an open end on the lower surface side of the first substrate 200 and a round bottom part on the upper surface side of the first substrate 200, and a recess part (the groove 320) including an open end on the upper surface side of the second substrate 300 and a round bottom part on the lower surface side of the second substrate 300. Here, the lower surface side of the first substrate 200 and the upper surface side of the second substrate 300 are both join surfaces of the first substrate 200 and the second substrate 300. For example, in the case when the outer diameter of the sheath heater 110 is 4.5 mm, the depth of the groove 220b of the first substrate 200 and the groove 320 of the second substrate 300 arranged with the sheath heater 110 are respectively 2.25 mm or more and 2.5 mm or less from the join surface of the first substrate 200 and the second substrate 300. The width of the groove 220b of the first substrate 200 and the groove 320 of the second substrate 300 arranged with the sheath heater 110 are 4.5 mm or more and 5.0 mm or less. By setting the shape and size of the combination of the groove 220b and the groove 320 arranged with the sheath heater 110 closer to the shape and size of the sheath heater 110, the contact area between the sheath heater 110 and the first substrate 200 and the second substrate 300 can be increased, and the heat energy generated by the sheath heater 110 to the first substrate 200 and the second substrate 300 can be efficiently transmitted.

Figure 4C:
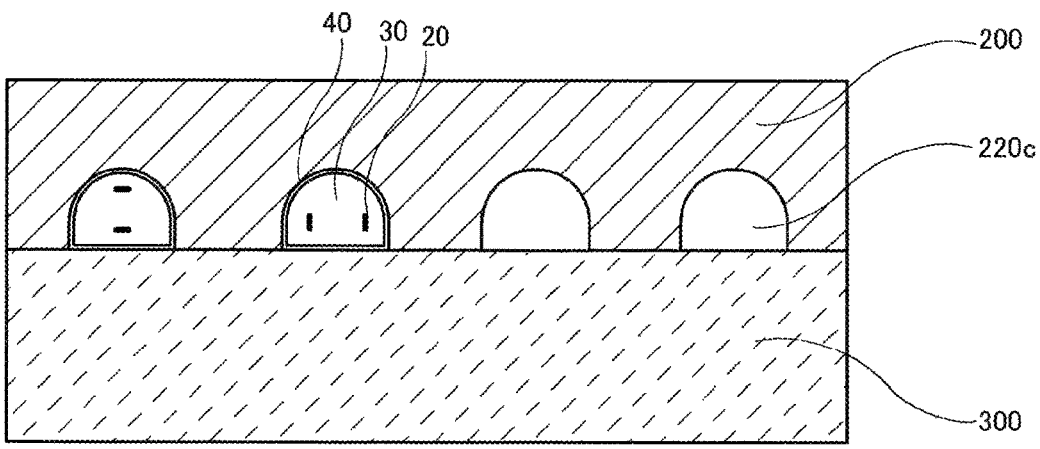
FIG. 4C is an expanded cross-sectional diagram of a heater unit according to one embodiment of the present invention.

Furthermore, as is shown in FIG. 4C, the shape and size of the groove can be appropriately designed so as to be able to modify the shape of the sheath heater 110 to match the groove. For example, as shown in FIG. 4C, the groove 220c arranged with the sheath heater 110 is a recess part including an open end on the lower surface side of the first substrate 200 and a round bottom part on the upper surface side of the first substrate 200. For example, in the case when the outer diameter of the sheath heater 110 is 4.5 mm, the depth of the groove 220c arranged with the sheath heater 110 is 4.0 mm or more and 4.5 mm or less from the lower surface of the first substrate 200. The width of the groove 220c arranged with the sheath heater 110 is 4.5 mm or more and 5.0 mm or less. By designing the cross-sectional area of the groove 220c arranged with the sheath heater 110 to be substantially the same as the cross-sectional area of the sheath heater 110, it is possible to finely adjust the shape of the sheath heater 110 when it is arranged in the groove 220c to match the shape of the groove 220c. By setting the shape and size of the sheath heater 110 closer to the shape and size of the groove 220c arranged with the sheath heater 110, the contact area between the sheath heater 110, the first substrate 200 and the second substrate 300 can be increased, and the thermal energy generated by the sheath heater 110 to the first substrate 200 and the second substrate 300 can be efficiently transmitted.

Although FIG. 4A to FIG. 4C show a structure in which the shape and size of the sheath heater 110 and the groove 220 and/or the groove 320 arranged with the sheath heater 110 are close to each other, the present invention is not limited to this structure. The shape and size of the sheath heater 110 and the groove 220 and/or the groove 320 may be different. Since the movement of the sheath heater 110 is not limited in the case when a space exists between the sheath heater 110 and the first substrate 200 and the second substrate 300, it is possible to suppress deformation due to thermal expansion and provide a highly reliable heater unit 100.

In the case when a space exists between the sheath heater 110 and the first substrate 200 and the second substrate 300, the space may be filled with a brazing material for example. Examples of brazing materials include alloys containing silver, copper and zinc, alloys containing copper and zinc, copper containing small amounts of phosphorus, aluminum and its alloys, alloys containing titanium, copper and nickel, alloys containing titanium, zirconium, and copper, and alloys containing titanium, zirconium, copper and nickel. Since aluminum substrates are used as the first substrate 200 and the second substrate 300 in the present embodiment, filling with aluminum is preferred. By using the same metal material for the brazing material, deformation due to thermal expansion can be suppressed, and a highly reliable heater unit 100 can be provided. By filling the space with a brazing material, the thermal energy generated by the sheath heater 110 can be efficiently transmit to the first substrate 200 and the second substrate 300.

a metal substrate can be used as the first substrate 200 and the second substrate 300. The thermal conductivity of the material which is used for the first substrate 200 and the second substrate 300 is preferably 200 W/mK or more. When the thermal conductivity of the material which is used for the first substrate 200 and the second substrate 300 is 200 W/mK or more, it is possible to transmit the thermal energy generated by the sheath heater 110 to the stage 240 efficiently.

The coefficient of thermal expansion of the materials which are used for the first substrate 200 and the second substrate 300 is preferably $25 \times 10^{-6}$/K or less. The difference in coefficient of thermal expansion between the materials which are used for the first substrate 200 and the second substrate 300 is preferred to be $10 \times 10^{-6}$/K or less. The materials which are used for the first substrate 200 and the second substrate 300 are more preferably materials which have the same degree of thermal expansion, and more preferably are the same metal material. In the present embodiment, an aluminum substrate is used as the first substrate 200 and the second substrate 300. However, the present invention is not limited to this and materials such as aluminum (Al), titanium (Ti), and stainless steel (SUS) can be used as materials for the first substrate 200 and the second substrate 300. Since the difference in thermal expansion coefficient between the materials which are used for the first substrate 200 and the second substrate 300 is $10 \times 10^{-6}$/K or less, it is possible to suppress deformation due to thermal expansion and provide a highly reliable heater unit 100.

Joining of the first substrate 200 and the second substrate 300 can be performed by brazing for example. For example, an alloy containing silver, copper and zinc, an alloy containing copper and zinc, copper containing a small amount of phosphorus, aluminum and its alloys, an alloy containing titanium, copper and nickel, an alloy containing titanium, zirconium and copper, and an alloy containing titanium, zirconium, copper and nickel. Since aluminum substrates are used as the first substrate 200 and the second substrate 300 in the present embodiment, brazing with aluminum is preferred. By using the same metal material for the brazing material, deformation due to thermal expansion can be suppressed, and a highly reliable heater unit 100 can be provided.

The sheath heater 110 according to the present embodiment is a single terminal type which has two connection terminals 50 at one end. For example, the first sheath heater 110a has two connection terminal 50a and connection terminal 50b at one end. Here, when the two connection terminal 50a and connection terminal 50b are not particularly distinguished, they can be referred to as connection terminals 50. One end of the sheath heater 110 which has the connection terminals 50 is extracted to the surface on the opposite side to first substrate 200 of the second substrate 300 through a through hole 340 which is arranged in approximately the center of the second substrate 300 from approximately the center part 260 of the first substrate 200. One end of the sheath heater 110 which includes the connection terminals 50 is connected to an external device (heater controller, power source and the like) through a hollow part of a cylindrical shaft 400. The sheath heater 110 is heated by electric power which is supplied from an external device and the temperature of the stage 240 is controlled. Although not shown in FIG. 3, the heater unit 100 may also be arranged with a temperature sensor, a gas pipe or a cooling pipe and the like via the hollow part of the shaft 400. Since the sheath heater 110 according to the present embodiment is a single terminal type, one end of the sheath heater 110 may be extracted for external connection and the hollow part of the shaft 400 can be used effectively.

[Sheath Heater Structure]

Figure 5A:
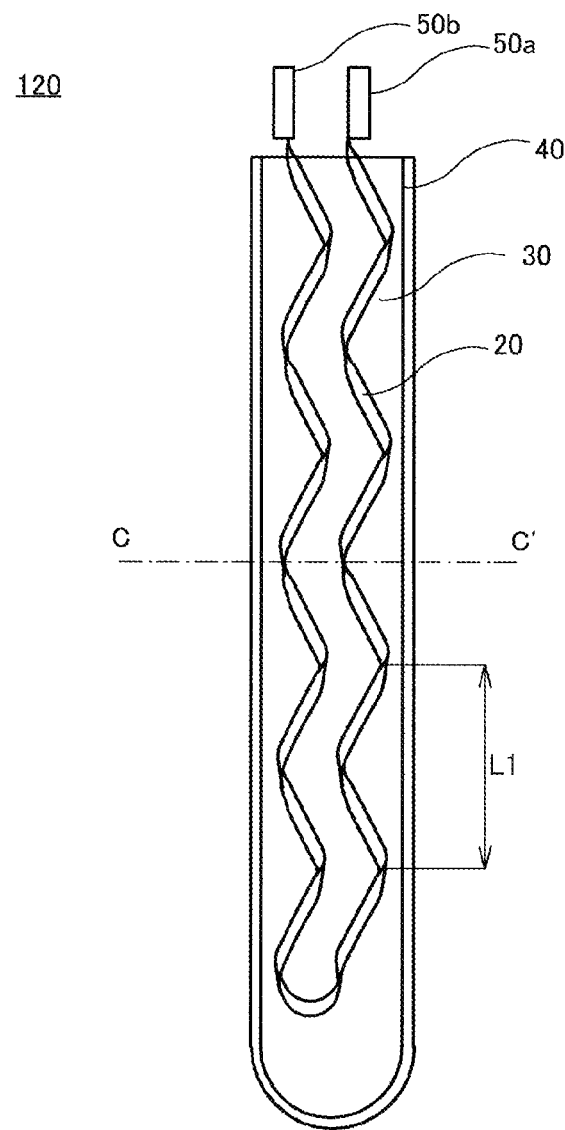
FIG. 5A is a cross-sectional diagram showing a structure of a sheath heater according to one embodiment of the present invention.
Figure 5B:
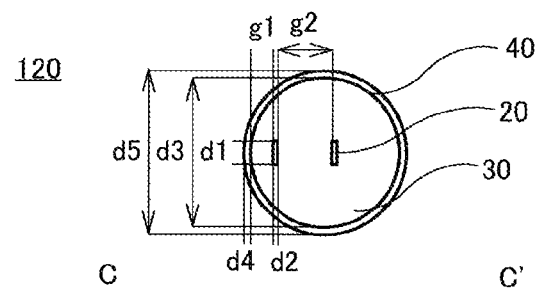
FIG. 5B is a cross-sectional diagram showing a structure of a sheath heater according to one embodiment of the present invention.

The structure of the sheath heater according to the first embodiment of the present invention is explained using FIG. 5A and FIG. 5B. FIG. 5A and FIG. 5B are cross-sectional diagrams showing the structure of the sheath heater according to one embodiment of the present invention. As is shown in FIG. 5A and FIG. 5B, the sheath heater according to the first embodiment includes a band shaped heating wire 20, an insulating material 30, a metal sheath 40 and connection terminals 50.

Referring to FIG. 5A, the heating wire 20 is arranged within the cylindrical metal sheath 40 with a gap. The heating wire 20 and the metal sheath 40 are insulated by the insulating material 30 which is arranged in the gap. Although the metal sheath 40 is shown in a shape with one end closed in FIG. 5A, the shape is not limited to this, and it may have a shape in which both ends are open. The heating wire 20 is arranged so as to reciprocate in a cylindrical axis direction within the metal sheath 40, and both ends of the heating wire 20 are arranged at one end of the metal sheath 40. That is, one heating wire 20 is arranged so as to be biaxial (two cores) in most of the metal sheath 40 in a cylindrical axis direction. Each heating wire 20 which is arranged in the metal sheath 40 is arranged with a gap and is insulated by the insulating material 30 arranged in the gap.

FIG. 5B is a cross-sectional diagram along the line C-C' in FIG. 5A. Referring to FIG. 5B, a width d1 of the band shaped heating wire 20 is preferred to be in a range of 0.1 mm or more and 2.0 mm or less. A thickness d2 of the band shaped heating wire 20 is preferred to be in a range of 0.1 mm or more and 0.5 mm or less. An inner diameter d3 of the metal sheath 40 is preferred to be in a range of 3.0 mm or more and 4.0 mm or less. A thickness d4 of the metal sheath 40 is preferred to be in a range of 0.5 mm or more and 1.0 mm or less. An outer diameter d5 of the metal sheath 40 is preferred to be in a range of 3.5 mm or more and 5.0 mm or less. By providing the sheath heater 120 according to the present embodiment with the structure described above, it is possible to reduce the diameter while maintaining reliability. By reducing the diameter of the sheath heater 120, the sheath heater 120 can be laid out in the heater unit 100 with a fine patterned shaped layout. The finer the pattern of the sheath heater 120, the more precisely it can be controlled in order to reduce the temperature distribution of the stage 240.

A shortest distance g1 between the metal sheath 40 and each heating wire 20 arranged within the metal sheath 40 in a cross section orthogonal to the cylindrical axis is preferred to be in a range of 0.3 mm or more and 1.0 mm or less. The shortest distance g1 between the metal sheath 40 and the heating wire 20 is more preferably in a range of 0.4 mm or more and 1.0 mm or less. By setting the shortest distance g1 between the metal sheath 40 and the heating wire 20 to 0.3 mm or more, the insulation between the metal sheath 40 and the heating wire 20 can be ensured. By setting the shortest distance g1 between the metal sheath 40 and the heating wire 20 equal to or less than 1.0 mm, the diameter of the sheath heater 120 can be reduced. By using the band shaped heating wire 20, the diameter of the sheath heater 120 according to the present embodiment can be reduced while maintaining reliability. By reducing the diameter of the sheath heater 120, the sheath heater 120 can be laid out in the heater unit 100 with a fine pattern shaped layout. The finer the pattern of the sheath heater 120, the more precisely it can be controlled in order to reduce the temperature distribution of the stage 240.

A shortest distance g2 of each heating wire 20 arranged within the metal sheath 40 in a cross section orthogonal to the cylindrical axis is preferred to be in a range of 0.3 mm or more and 2.0 mm or less. The shortest distance g2 of each heating wire 20 arranged within the metal sheath 40 is more preferably in a range of 0.4 mm or more and 1.0 mm or less. By setting the shortest distance g2 of the biaxial heating wire 20 to 0.3 mm or more, the insulation of the heating wire 20 can be ensured. By setting the shortest distance g2 of the biaxial heating wire 20 to 2.0 mm or less, the diameter of the sheath heater 120 can be reduced. The diameter of the sheath heater 120 according to the present embodiment can be reduced while maintaining reliability by using the bans shaped heating wire 20. By reducing the diameter of the sheath heater 120, the sheath heater 120 can be laid out in the heater unit 100 with a fine pattern shaped layout. The finer the pattern of the sheath heater 120, the more precisely it can be controlled in order to reduce the temperature distribution of the stage 240.

Both ends of the heating wire 20 are arranged with a connection terminal 50a and a connection terminal 50b that are electrically connected respectively. Here, when the connection terminal 50a and the connection terminal 50b are not particularly distinguished, they are referred to as connection terminals 50. The sheath heater 120 of the present embodiment has a biaxial single-terminal type (two-core single-terminal type) structure in which the two connection terminals 50 are arranged at one end of the sheath heater 120, and as a result, it is possible to effectively utilizing the hollow part of the shaft 400, and it is possible to arrange more sheath heaters 120 in the heater unit 100. The larger the number of sheath heaters 120 which are arranged in the heater unit 100, the more precisely control can be performed in order to reduce the temperature distribution of the stage 240.

In the region where the heating wire 20 is biaxial within the metal sheath 40, the band shaped heating wire 20 is arranged so as to rotate with respect to the cylindrical axis direction of the metal sheath 40. The band shaped heating wire 20 extends in the cylindrical axis direction in a state where the long axis of the heating wire 20 rotates in a direction which is perpendicular to the cylindrical axis of the metal sheath 40. That is, each heating wire 20 is in a coiled spiral state. The rotational axes of the biaxial heating wires 20 are respectively arranged substantially parallel to the cylindrical axis direction of the metal sheath 40. By arranging the heating wire 20 in a coiled state, the length of the heating wire 20 arranged in the metal sheath 40 is increased, and the resistance value of the sheath heater 120 can be increased. Furthermore, since the heating wire 20 has spring properties due to being arranged in a coiled state, disconnection during thermal expansion is suppressed. As a result, for example, even if the difference in thermal expansion coefficient between the metal sheath 40 and the heating wire 20 is large, it is possible to provide the sheath heater 120 with improved reliability.

A rotation pitch L1, which is the length in the cylindrical length axis direction of the metal sheath 40 in which the heating wire 20 which is arranged within the metal sheath 40 rotates once in a spiral, is preferred to be 3.0 mm or less. The rotation pitch L1 of the heating wire 20 which is arranged within the metal sheath 40 is more preferably 2.5 mm or less, and more preferably 2.0 mm or less. By setting the rotation pitch L1 of the heating wire 20 which is arranged within the metal sheath 40 to 3.0 mm or less, disconnection during thermal expansion is suppressed and it is possible to provide the sheath heater 120 with improved reliability.

FIG. 5B is a cross-sectional diagram along the line C-C' in FIG. 5A. Referring to FIG. 5B, in the region where the heating wire 20 is biaxial within the metal sheath 40, the surface direction formed by the width d1 of the heating wire 20 is substantially perpendicular to the normal line of the rotating surface. That is, the surface of the band shaped heating wire 20 is a tangential plane of the rotating surface. Furthermore, the surface direction of the biaxial heating wire 20 is substantially parallel. The direction in which the central axis of each heating wire 20 rotates spirally in the cylindrical axis direction of the metal sheath 40 is substantially the same. The rotation pitch L1 is also the same. Since the rotation direction and the rotation pitch L1 of each heating wire 20 are the same, the distance g2 between the biaxial heating wires 20 can be constantly maintained, and the reliability of the sheath heater 120 can be maintained. However, the present invention is not limited to this and the rotation direction and/or the rotation pitch L1 of each heating wire 20 may be different. The sheath heater 120 according to the present embodiment is designed so that reliability can be maintained even if the rotation of the heating wire 20 is considered by meeting the conditions described above.

The cross-sectional shape of the sheath heater 120 according to the present embodiment is circular. Since the cross-sectional shape of the sheath heater 120 is circular, the sheath heater 120 can be easily bent into a desired shape, and can be easily arranged within the groove 220 of the first substrate 200 and/or the groove 320 of the second substrate 300. However, the cross sectional shape of the sheath heater 120, the shape of the bottom part of the groove 220 and/or the shape of the bottom part of the groove 320 is not limited to this and they can have any shape and they can also be transformed into any shape as long as the conditions describe above are met.

A conductor which generates Joule heat when conducting can be used for the band shaped heating wire 20. Specifically, the conductor may include a metal selected from tungsten, tantalum, molybdenum, platinum, nickel, chromium, and cobalt. The metal may be an alloy including these metals, for example, an alloy of nickel and chromium, or an alloy including nickel, chromium and cobalt. In the present embodiment, a nickel chromium alloy is used as the material of the heating wire 20.

The insulating material 30 is arranged in order to suppress the heating wire 20 from being electrically connected to other members. That is, a material which sufficiently insulates the heating wire 20 from other members can be used for the insulating material 30. Furthermore, the thermal conductivity of the material which is used for the insulating material 30 is preferred to be 10 W/mK or more. When the material which is used for the insulating material 30 has a thermal conductivity of 10 W/mK or more, the thermal energy which is generated by the heating wire 20 can be efficiently transmitted to the metal sheath 40. As the insulating material 30, magnesium oxide, aluminum oxide, boron nitride, aluminum nitride and the like can be used. In the present embodiment, magnesium oxide (MgO) powder is used as the insulating material 30. The thermal conductivity of the compact powder of magnesium oxide (MgO) is about 10 W/mK.

The thermal conductivity of the material which is used for the metal sheath 40 is preferred to be 200 W/mK or more. When the thermal conductivity of the material which is used for the metal sheath 40 is 200 W/mK or more, the thermal energy which is generated by the heating wire 20 can be efficiently transmitted to the first substrate 200 and the second substrate 300.

Furthermore, the coefficient of thermal expansion of the material which is used for the metal sheath 40 is preferred to be $25 \times 10^{-6}$/K or less. The difference in the coefficient of thermal expansion between the materials which are used for the metal sheath 40, the first substrate 200 and the second substrate 300 is preferred to be $10 \times 10^{-6}$/K or less. The materials which are used for the metal sheath 40, the first substrate 200 and the second substrate 300 are more preferably materials which have the same degree of thermal expansion, and more preferably are the same metal material. In the present embodiment, aluminum is used as the material of the metal sheath 40, the first substrate 200 and the second substrate 300. However, the present invention is not limited to this, and materials such as aluminum (Al), titanium (Ti) and stainless steel (SUS) can bee used as materials for the metal sheath 40, the first substrate 200 and the second substrate 300. When the difference in coefficient of thermal expansion between the materials which are used for the metal sheath 40, the first substrate 200 and the second substrate 300 is $10 \times 10^{-6}$/K or less, it is possible to suppress deformation due to thermal expansion and provide the heater unit 100 with high reliability.

As is described above, the diameter of the sheath heater 120 according to the present embodiment can be reduced by including the band shaped heating wire 20. By reducing the diameter of the sheath heater 120, it is possible to provide the heater unit 100 with a fine pattern shaped layout, and it is possible to perform precise control so that the temperature distribution of the stage 240 can be restricted. By arranging the band shaped heating wire 20 in a spiral state within the sheath heater 120, disconnection of the heating wire 20 during thermal expansion can be suppressed. For example, even if the difference in the coefficient of thermal expansion between the metal sheath 40 and the heating wire 20 is large, the sheath heater 120 with improved reliability can be provided. Since it is possible to use the same metal material for the metal sheath 40, the first substrate 200 and the second substrate 300, it is possible to suppress deformation of the heater unit 100 due to thermal expansion and the reliability can be improved.

Second Embodiment

[Sheath Heater Structure]

Figure 6A:
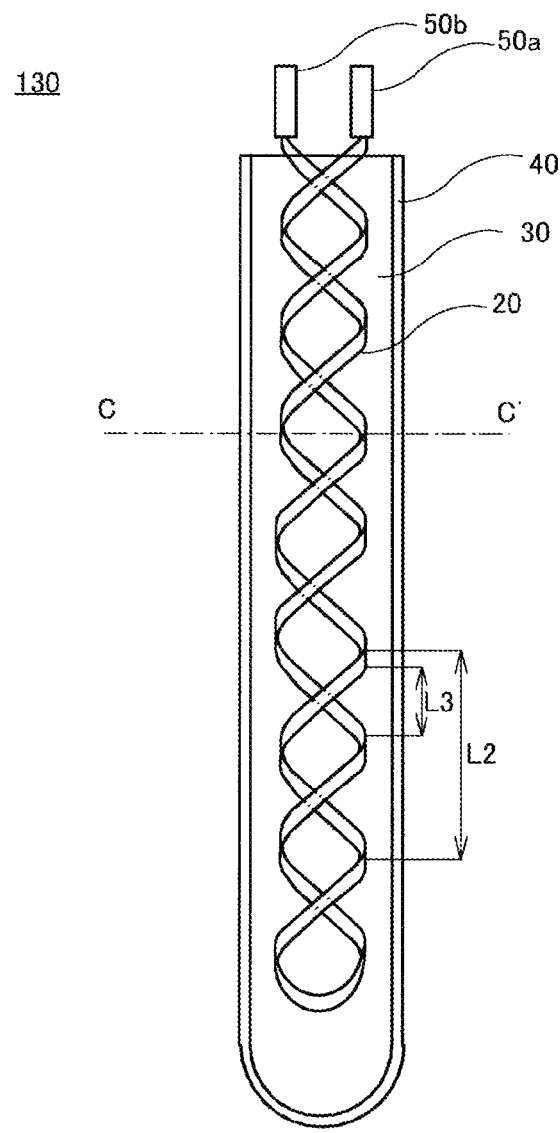
FIG. 6A is a cross-sectional diagram showing a structure of a sheath heater according to one embodiment of the present invention.
Figure 6B:
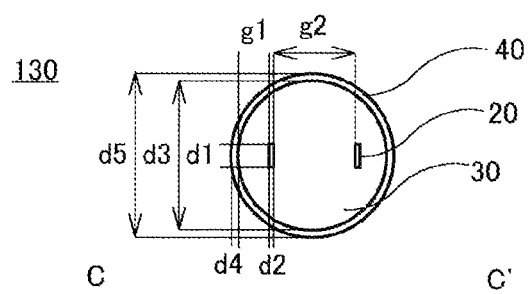
FIG. 6B is a cross-sectional diagram showing a structure of a sheath heater according to one embodiment of the present invention.

The structure of the sheath heater according to the second embodiment of the present invention is explained using FIG. 6A and FIG. 6B. FIG. 6A and FIG. 6B are cross-sectional diagrams showing the structure of the sheath heater according to one embodiment of the present invention. As is shown in FIG. 6A and FIG. 6B, the sheath heater according to the second embodiment includes a band shaped heating wire 20, an insulating material 30, a metal sheath 40 and connection terminals 50 the same as in the first embodiment. Since the sheath heater 130 according to the second embodiment is the same as in the first embodiment including the heater unit except for the arrangement of the heating wire 20 within the metal sheath 40, an explanation of overlapping structure and composition is omitted and mainly the differences are explained.

Referring to FIG. 6A, the heating wire 20 is arranged with a gap within the cylindrical metal sheath 40. The heating wire 20 and the metal sheath 40 are insulated by the insulating material 30 which is arranged in the gap. Although the metal sheath 40 is shown in a shape with one end closed in FIG. 6A, the present embodiment is not limited to this structure and may have a shape in which both ends are open. The heating wire 20 which is arranged so as to reciprocate in the cylindrical axis direction within the metal sheath 40, and both ends of the heating wire 20 are arranged at one end of the metal sheath 40. That is, one heating wire 20 is arranged so as to be biaxial (two cores) in most of the metal sheath 40 in the cylindrical axis direction. Each heating wire 20 which is arranged within the metal sheath 40 is arranged with a gap and is insulated by an insulating material 30 arranged in the gap.

FIG. 6B is a cross-sectional diagram along the line C-C' in FIG. 6A. Referring to FIG. 6B, the width d1 of the band shaped heating wire 20 is preferred to be in a range of 0.1 mm or more and 2.0 mm or less. The thickness d2 of the band shaped heating wire 20 is preferred to be in a range of 0.1 mm or more and 0.5 mm or less. The inner diameter d3 of the metal sheath 40 is preferred to be in a range of 3.0 mm or more and 4.0 mm or less. The thickness d4 of the metal sheath 40 is preferred to be in a range of 0.5 mm or more and 1.0 mm or less. The outer diameter d5 of the metal sheath 40 is preferred to be in a range of 3.5 mm or more and 5.0 mm or less. By providing the sheath heater 130 according to the present embodiment with the structure described above, the diameter of the sheath heater 130 can be reduced while maintaining reliability. By reducing the diameter of the sheath heater 130, the sheath heater 130 can be laid out in the heater unit 100 with a fine pattern shaped layout. The finer the pattern of the sheath heater 130, the more precisely it can be controlled in order to reduce the temperature distribution of the stage 240.

The shortest distance g1 between the metal sheath 40 and each heating wire 20 arranged within the metal sheath 40 in a cross section orthogonal to the cylindrical axis is preferred to be in a range of 0.3 mm or more and 1.0 mm or less. The shortest distance g1 between the metal sheath 40 and the heating wire 20 is more preferably in a range of 0.4 mm or more and 1.0 mm or less. By setting the shortest distance g1 between the metal sheath 40 and the heating wire 20 to 0.3 mm or more, the insulation between the metal sheath 40 and the heating wire 20 can be ensured. By setting the shortest distance g1 between the metal sheath 40 and the heating wire 20 to 1.0 mm or less, the diameter of the sheath heater 130 can be reduced. By using the band shaped heating wire 20, the diameter of the sheath heater 130 according to the present embodiment can be reduced while maintaining reliability. By reducing the diameter of the sheath heater 130, the sheath heater 130 can be laid out in the heater unit 100 with a fine pattern shaped layout. The finer the pattern of the sheath heater 130, the more precisely it can be controlled in order to reduce the temperature distribution of the stage 240.

A shortest distance g2 of each heating wire 20 arranged within the metal sheath 40 in the cross section orthogonal to the cylindrical axis is preferred to be in a range of 0.3 mm or more and 2.0 mm or less. The shortest distance g2 of each heating wire 20 which is arranged within the metal sheath 40 is more preferably in a range of 0.4 mm or more and 1.0 mm or less. By setting the shortest distance g2 of the biaxial heating wire 20 to 0.3 mm or more, the insulation of the heating wire 20 can be ensured. By setting the shortest distance g2 of the biaxial heating wire 20 to 2.0 mm or less, the diameter of the sheath heater 130 can be reduced. By using the band shaped heating wire 20, the diameter of the sheath heater 130 according to the present embodiment can be reduced while maintaining reliability. By reducing the diameter of the sheath heater 130, the sheath heater 130 can be laid out in the heater unit 100 with a fine pattern shaped layout. The finer the pattern of the sheath heater 130, the more precisely it can be controlled in order to reduce the temperature distribution of the stage 240.

Both ends of the heating wire 20 are arranged with a connection terminal 50a and a connection terminal 50b that are electrically connected respectively. Here, when the connection terminal 50a and the connection terminal 50b are not particularly distinguished, they are referred to as connection terminals 50. The sheath heater 130 of the present embodiment has a biaxial single terminal type (two-core single terminal) structure in which the two connection terminals 50 are arranged at one end of the sheath heater 130, so that a hollow part of the shaft 400 can be used effectively and it is possible to arrange more sheath heaters 130 in the heater unit 100. As the number of sheath heaters 130 arranged in the heater unit 100 increases, precise control can be performed so that the temperature distribution of the stage 240 can be reduced.

The band shaped heating wire 20 is arranged to rotate with respect to the cylindrical axis direction of the metal sheath 40 in a region where the heating wire 20 is biaxial within the metal sheath 40. The band shaped heating wire 20 extends in the cylindrical axis direction in a state where the long axis of the heating wire 20 rotates in a direction perpendicular to the cylindrical axis direction of the metal sheath 40. Furthermore, the heating wires 20 are arranged so that the rotation axes of the heating wires 20 are substantially the same in the region where the heating wires 20 are biaxial within the metal sheath 40. That is, the biaxial heating wire 20 is coiled in a double helix shape. The rotation axis of the biaxial heating wire 20 is arranged substantially parallel to the cylindrical axis direction of the metal sheath 40. By arranging the heating wire 20 in a coiled state, the length of the heating wire 20 which is arranged in the metal sheath 40 is increased, and the resistance value of the sheath heater 130 can be increased. Furthermore, since the heating wire 20 has a spring property by being arranged in a coiled state, disconnection during thermal expansion is suppressed. As a result, for example, even if the difference in the coefficient of thermal expansion between the metal sheath 40 and the heating wire 20 is large, it is possible to provide the sheath heater 130 with improved reliability.

The rotation pitch L2, which is the length in the cylindrical length axis direction of the metal sheath 40 in which the heating wire 20 arranged within the metal sheath 40 rotates once in a spiral, is preferred to be 6.0 mm or less. The rotation pitch L2 of the heating wire 20 which is arranged within the metal sheath 40 is more preferably 2.5 mm or less, and even more preferably 2.0 mm or less. By setting the rotation pitch L2 of the heating wire 20 which is arranged within the metal sheath 40 to 2.0 mm or less, it is possible to provide a sheath heater 130 with improved reliability by suppressing disconnection during thermal expansion. Furthermore, the shortest distance L3 in the direction of the rotation axis of each heating wire 20 is preferred to be 2.3 mm or more in the region where the heating wire 20 is biaxial within the metal sheath 40. By setting the distance L3 of the biaxial heating wire 20 to 2.3 mm or more, the insulation of the heating wire 20 can be ensured.

FIG. 6B is a cross-sectional diagram along the line C-C' in FIG. 6A. Referring to FIG. 6B, the surface direction formed by the width d1 of the heating wire 20 is substantially perpendicular to the normal line of the rotation surface in the region where the heating wire 20 is biaxial within the metal sheath 40. That is, the surface of the band shaped heating wire 20 is a tangential plane of the rotation surface. Furthermore, the surface direction of the biaxial heating wire 20 is substantially parallel. The direction in which the center axis of each heating wire 20 rotates in a double helix shape in the cylindrical axis direction of the metal sheath 40 is shifted by 180°. The rotation pitch L 2 is substantially the same. That is, the rotation of each heating wire 20 is shifted by a ½ pitch. Since the rotation pitch L2 of each heating wire 20 are the same, the distance g2 between the biaxial heating wires 20 can be constantly maintained, and the reliability of the sheath heater 130 can be maintained. However, the present invention is not limited to this structure, and the shift in the rotation direction of each heating wire 20 does not have to be 180°. As long as the shortest distance L3 in the cylindrical axis direction of the metal sheath 40 of the biaxial heating wire 20 meets g2 or more, then design is carried out so that it is possible to maintain reliability of the sheath heater 130 according to the present embodiment even if the rotation of the heating wire 20 is considered.

The cross-sectional shape of the sheath heater 130 according to the present embodiment is circular. Since the cross-sectional shape of the sheath heater 130 is circular, the sheath heater 130 can be easily bent into a desired shape, and the groove 220 of the first substrate 200 and/or the groove 320 of the second substrate 300 can be easily arranged. However, the cross sectional shape of the sheath heater 130, the shape of the bottom part of the groove 220 and/or the shape of the bottom part of the groove 320 is not limited to this and they can have any shape and they can also be transformed into any shape as long as the conditions describe above are met.

As is described above, by including the band shaped heating wire 20, the diameter of the sheath heater 130 according to the present embodiment can be reduced. By reducing the diameter of the sheath heater 130, it is possible provide the heater unit 100 with a fine pattern shaped layout, and it is possible to perform precise control so that the temperature distribution of the stage 240 can be restricted. By arranging the band shaped heating wire 20 in a state in which it rotates in a double helix shape within the sheath heater 130, disconnection of the heating wire 20 during thermal expansion can be suppressed. For example, even if the difference in the coefficient of thermal expansion between the metal sheath 40 and the heating wire 20 is large, the sheath heater 130 with improved reliability can be provided. By being able to use the same metal material for the metal sheath 40, the first substrate 200 and the second substrate 300, it is possible to suppress deformation of the heater unit 100 due to thermal expansion and the reliability can be improved.

Each embodiment described above as embodiments of the present invention can be implemented in combination as appropriate as long as they do not contradict each other. In addition, those skilled in the art could appropriately add, delete or change the design of the constituent elements based on each embodiment, as long as it does not depart from the concept of the present invention and such changes are included within the scope of the present invention.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

EXAMPLES

Although the present invention is explained in more detail based on examples and comparative examples below, the present invention is not limited to these examples and can be appropriately modified without departing from the spirit of the present invention.

Example 1

Figure 7B:
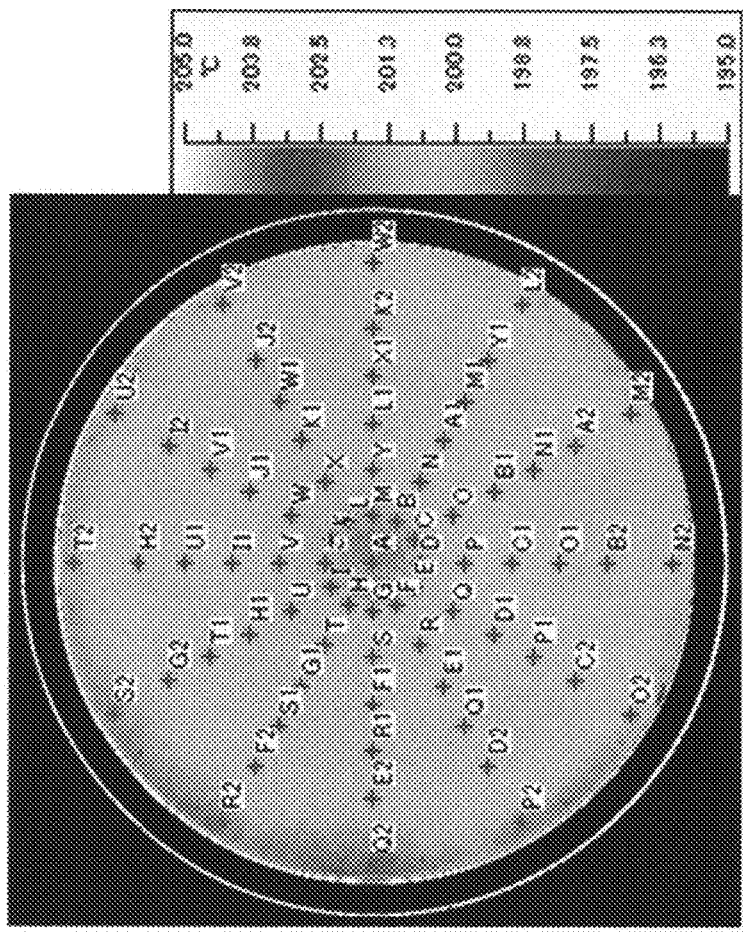
FIG. 7B is a diagram showing a temperature distribution of a heater unit of an example.
Figure 7A:
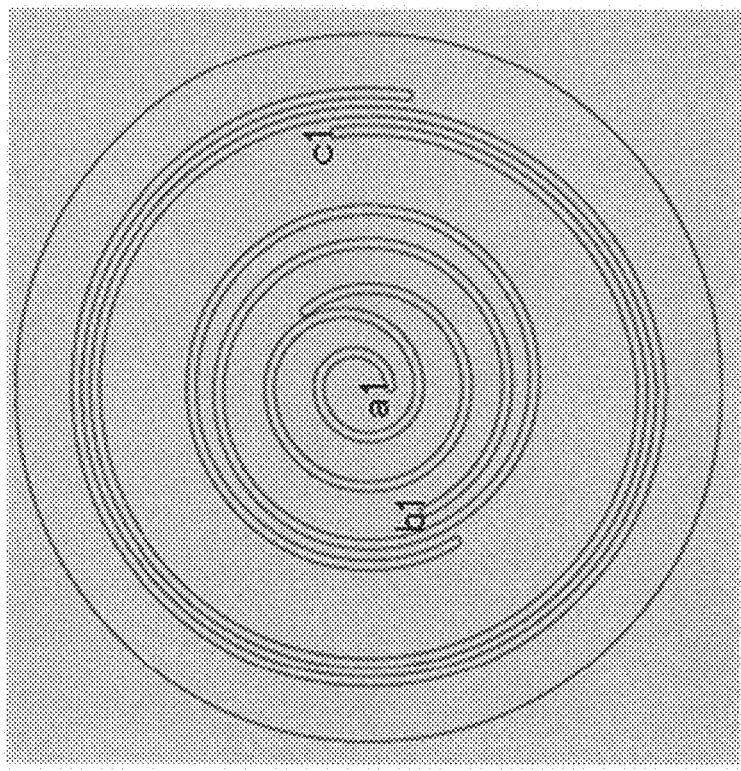
FIG. 7A is a diagram showing a pattern layout of a sheath heater in the heater unit of an example.

FIG. 7A is a cross-sectional structural diagram showing a pattern layout of the sheath heater of the heater unit according to the Example 1 of the present invention. The heater unit according to Example 1 has substantially the same structure as in the first embodiment described above, and each parameter is as follows.

Material of the first substrate and the second substrate: aluminum

Thickness of the first substrate and the second substrate: 15 mm

Diameter of the first substrate and the second substrate: 330 mm

Pattern of sheath heater: 3 zones (FIG. 7A)

Sheath heater structure: 2-core single terminal type

Minimum bending radius of sheath heater: 9 mm

Material of the heating wire 20: nickel chromium alloy (80% nickel, 20% chromium)

Width d1 of heating wire 20: 0.75 mm

Thickness d2 of heating wire 20: 0.2 mm Shortest distance between biaxial heating wires 20: 0.5 mm Distance between rotation axes of heating wires 20: 1.5 mm Rotation diameter of heating wire 20: 1 mm Rotation pitch L1 of heating wire 20: 2 mm Minimum distance between metal sheath 40 and heating wire 20: 0.5 mm Material of metal sheath 40: aluminum Inner diameter d3 of metal sheath 40: 3.5 mm Thickness d4 of metal sheath 40: 0.5 mm Outer diameter d5 of metal sheath 40: 4.5 mm Comparative Example 1

Figure 8B:
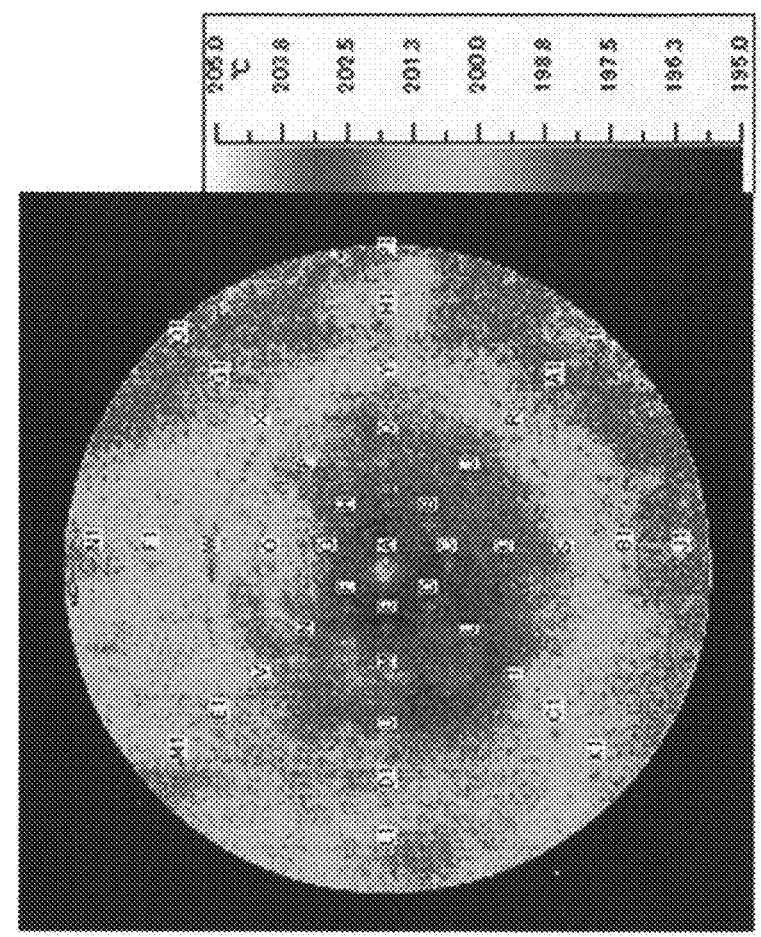
FIG. 8B is a diagram showing a temperature distribution of a heater unit of a comparative example.
Figure 8A:
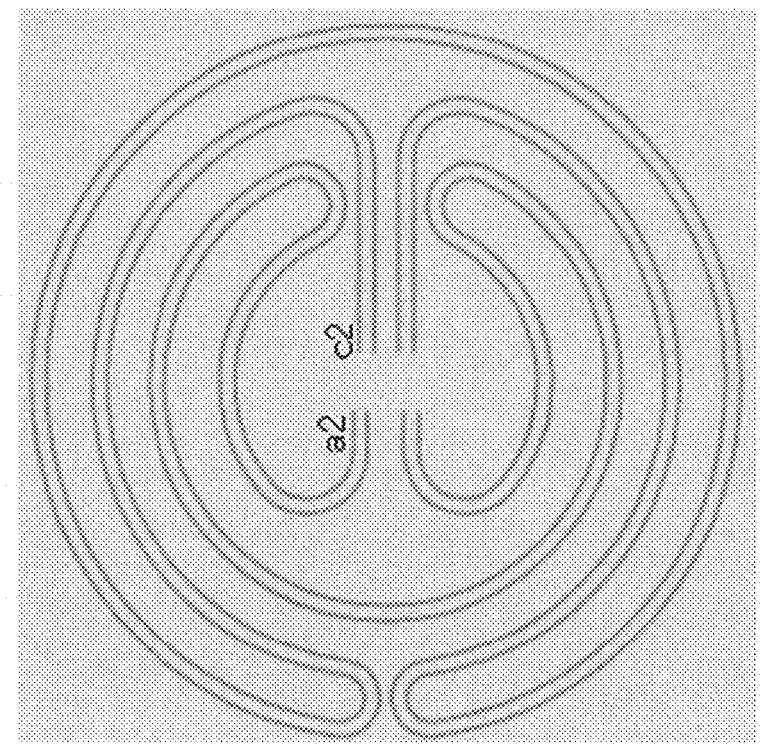
FIG. 8A is a diagram showing a pattern layout of a sheath heater in a heater unit of a comparative example.

FIG. 8A is a cross-sectional structural diagram showing a pattern layout of a sheath heater of a heater unit according to Comparative Example 1 of the present invention. The heater unit according to Comparative Example 1 is arranged with a single-core two-terminal type sheath heater in which a round heating wire is spirally coiled. Each parameter is as follows.

Material of the first substrate and the second substrate: aluminum

Thickness of the first substrate and the second substrate: 15 mm

Diameter of the first substrate and the second substrate: 330 mm

Pattern of sheath heater: 2 zones (FIG. 8A)

Sheath heater structure: 1-core double-terminal type

Minimum bending radius of sheath heater: 15.5 mm

Material of the heating wire 20: nickel chromium alloy (80% nickel, 20% chromium)

Round wire diameter of heating wire 20: φ0.5 mm Rotation diameter of heating wire 20: 2 mm Rotation pitch L1 of heating wire 20: 2 mm Minimum distance between metal sheath 40 and heating wire 20: 1.5 mm Material of metal sheath 40: aluminum Inner diameter of metal sheath 40: 5.2 mm Thickness of metal sheath 40: 0.5 mm Outer diameter of metal sheath 40: 6.2 mm

[Pattern Layout]

The pattern layouts of the sheath heaters in the heater units of Example 1 and Comparative Example 1 described above were compared. The sheath heater in the heater unit of the Example 1 has a two-core single-terminal structure so that one terminal is extracted from the hollow part of the shaft per one sheath heater. As a result, the hollow part of a shaft can be used effectively and it is possible to arrange three sheath heaters in a heater unit. In addition, since the outer diameter of the sheath heater is small at 4.5 mm, the minimum bending radius of the sheath heater is sufficiently small, and it is possible to provide the heat unit with a fine pattern shaped layout as is shown in FIG. 7A. On the other hand, the sheath heater in the heater unit of Comparative Example 1 has a single-core two-terminal structure so that two terminals are extracted from the hollow part of the shaft per one sheath heater. As a result, the extraction of a terminal in the hollow part of the shaft is crowded, and only two sheath heaters can be arranged in the heater unit. In addition, since the outer diameter of the sheath heater is 6.2 mm, the minimum bending radius of the sheath heater is large, and only a heater unit with a rough pattern shaped layout can be provided as is shown in FIG. 8A.

[Temperature Distribution Evaluation]

The temperature distribution during heating of the heater was measured using the heater unit according to Example 1 described above. The setting conditions when heating the heater (200° C.) in Example 1 are as follows.

Amount of heat generated by a first heater a1 (inner side): 500 W

Amount of heat generated by a second heater b1 (center): 1200 W

Amount of heat generated by a third heater c1 (outer side): 1200 W.

The temperature distribution during heating of the heater was measured using the heater unit according to Comparative Example 1 described above. The setting conditions when heating the heater (200° C.) in the Comparative Example 1 are as follows.

Amount of heat generated by a first heater a2 (inner side): 2000 W

Amount of heat generated by a third heater c2 (outer side): 2000 W.

Figure 7C:
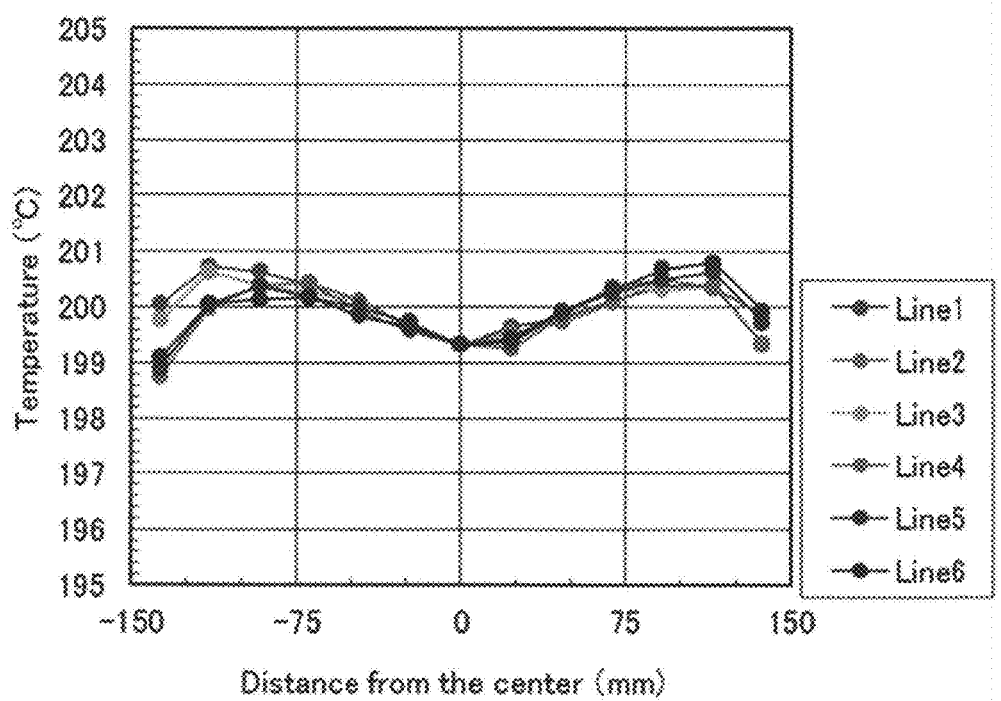
FIG. 7C is a diagram showing a temperature distribution of a heater unit of an example.
Figure 8C:
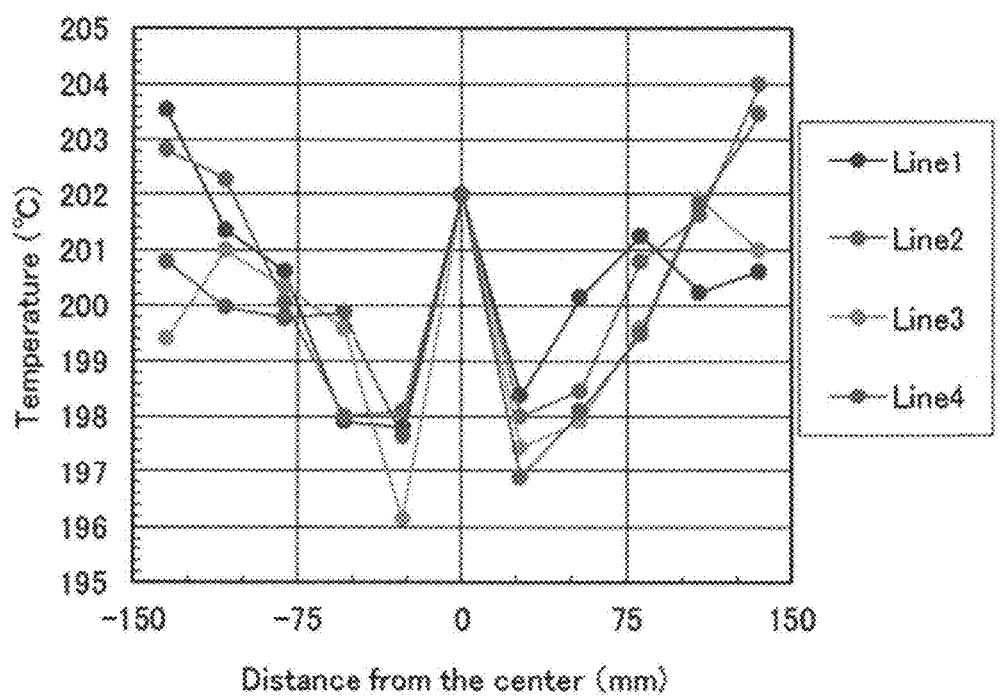
FIG. 8C is a diagram showing a temperature distribution of a heater unit of a comparative example.

The surface temperature of the stage in the heater unit according to Example 1 and Comparative Example 1 when equilibrium was reached under the setting conditions described above was measured using infrared thermography (manufactured by FLIR). IR images of the heater units according to Example 1 and Comparative Example 1 are shown in FIG. 7B and FIG. 8B. The temperature change on the line T2-N2 (Line 1), line U2-O2 (Line 2), line V2-P2 (Line 3), line Q2-W2 (Line 4), line R2-L2 (Line 5) and line S2-M2 (Line 6) in FIG. 7B of the heater unit according to Example 1 are shown in FIG. 7C. The temperature change on the line N1-J1 (Line 1), line O1-K1 (Line 2), line L1-P1 (Line 3), and line M1-II (Line 4) in FIG. 8B of the heater unit according to Comparative Example 1 are shown in FIG. 8C.

As is shown in FIG. 7B and FIG. 7C, in the heater unit according to Example 1, a large temperature distribution was not observed on the surface of the stage. The position which showed the maximum temperature was the periphery region of the first substrate and the temperature was 200.8° C. On the other hand, the section which showed the minimum temperature was the outermost periphery region of the first substrate and the temperature was 198.7° C. which was about 2° C. different from the maximum temperature. On the other hand, as is shown in FIG. 8B and FIG. 8C, in the heater unit according to Comparative Example 1, a large temperature distribution was observed on the surface of the stage and the temperature decreased significantly from the periphery area toward the central area. The position which showed the maximum temperature was the periphery region of the first substrate and the temperature was 204° C. On the other hand, the section which showed the minimum temperature was the central region of the first substrate and the temperature was 196.1° C., which was about 8° C. different from the maximum temperature.

From the above results, it was understood that in the heater unit according to Example 1 the stage can be heated uniformly. Therefore, by using a film forming device or a film processing device arranged with this heater unit, various thin films having uniform characteristics can be formed on a substrate, or uniform procession can be performed with respect to a thin film on a substrate, thereby it is possible to control the semiconductor process more precisely.

Example 2

Figure 9B:
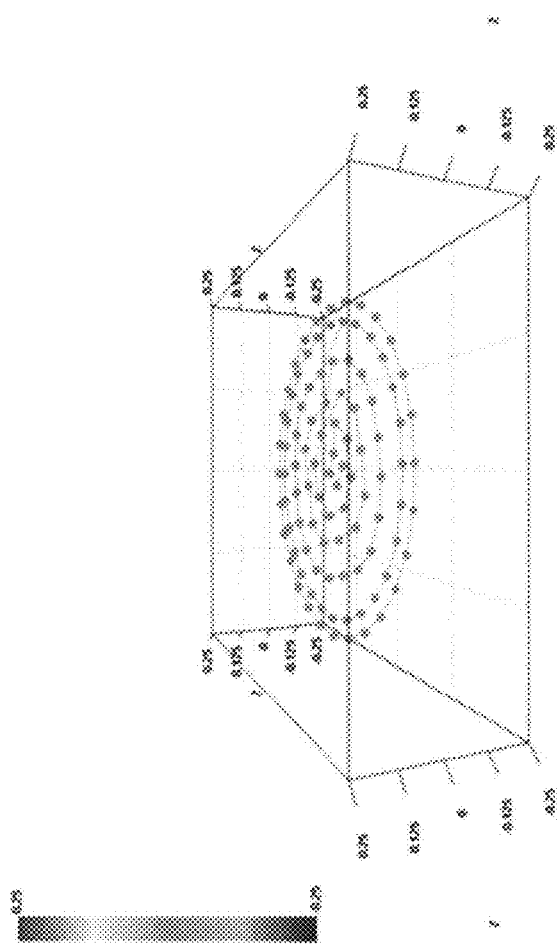
FIG. 9B is a diagram showing a surface shape of a heater unit of an example.
Figure 9A:
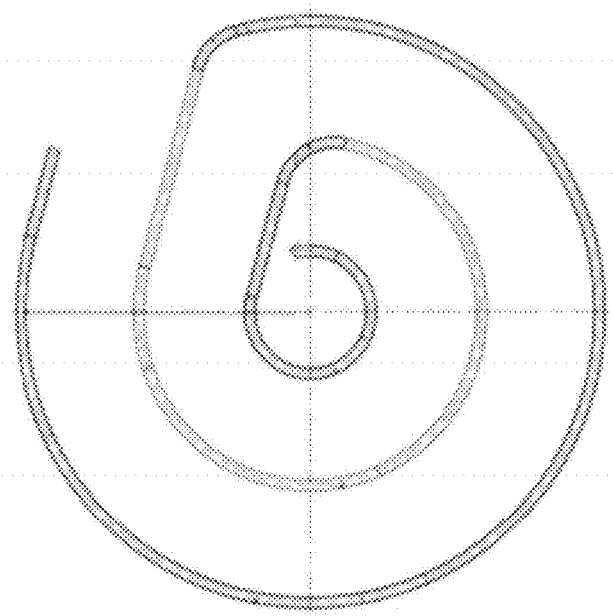
FIG. 9A is a diagram showing a pattern layout of a sheath heater in a heater unit of an example.

FIG. 9A is a cross-sectional structural diagram showing a pattern layout of a sheath heater of a heater unit according to Example 2 of the present invention. The heater unit according to Example 2 has substantially the same structure as in the first embodiment described above, and each parameter is as follows.

Material of first substrate and second substrate: aluminum

Thickness of first substrate and second substrate: 5 mm

Diameter of first substrate and second substrate: 330 mm

Pattern of sheath heater: 1 zone (FIG. 9A)

Sheath heater structure: 2-core single terminal type

Minimum bending radius of sheath heater: 9 mm

Material of the heating wire 20: nickel chromium alloy (80% nickel, 20% chromium)

Width d1 of heating wire 20: 0.75 mm

Thickness d2 of heating wire 20: 0.2 mm

Shortest distance between biaxial heating wires 20: 0.5 mm

Distance between rotation axes of heating wires 20: 1.5 mm

Rotation diameter of heating wire 20: 1 mm

Rotation pitch L1 of heating wire 20: 2 mm

Minimum distance between metal sheath 40 and heating wire 20: 0.5 mm

Material of metal sheath 40: aluminum

Inner diameter d3 of metal sheath 40: 3.5 mm

Thickness d4 of metal sheath 40: 0.5 mm

Outer diameter d5 of metal sheath 40: 4.5 mm.

Comparative Example 2

Figure 10B:
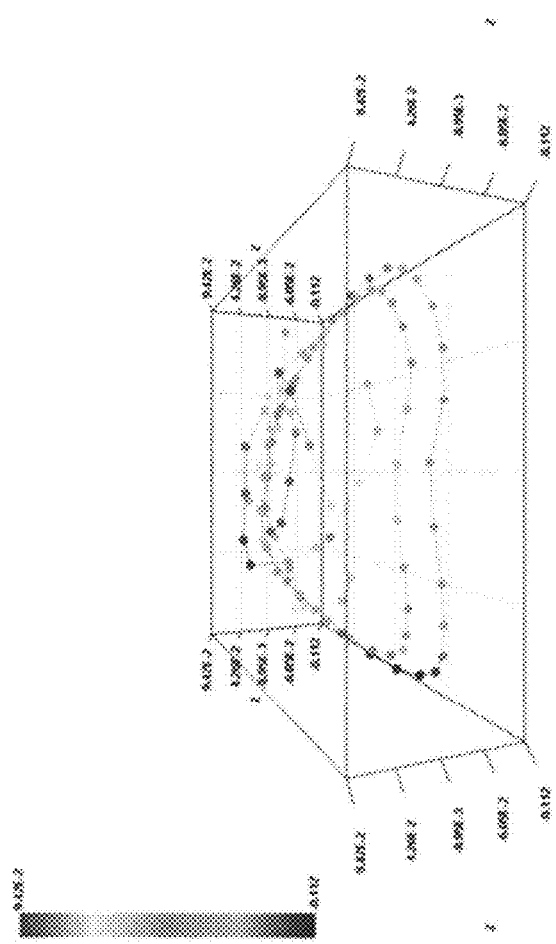
FIG. 10B is a diagram showing a surface shape of a heater unit of a comparative example.
Figure 10A:
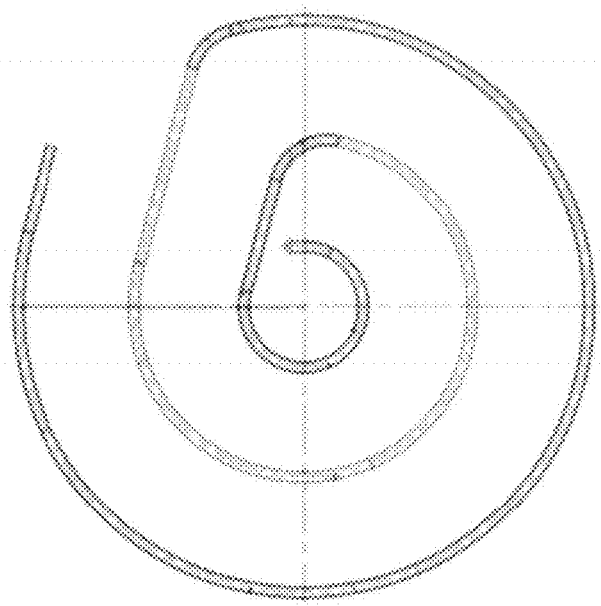
FIG. 10A is a diagram showing a pattern layout of a sheath heater in a heater unit of a comparative example.

FIG. 10A is a cross-sectional structural diagram showing a pattern layout of a sheath heater of a heater unit according to Comparative Example 2 of the present invention. The heater unit according to Comparative Example 2 is arranged with a two-core single-terminal sheath heater in which round heating wires are arranged linearly. In the heater unit according to Comparative Example 2, the material of the heating wire is a nickel chromium alloy, and the material of the metal sheath is SUS. Each parameter is as follows.

Material of first substrate and second substrate: aluminum

Thickness of first substrate and second substrate: 5 mm

Diameter of first substrate and second substrate: 330 mm

Pattern of sheath heater: 1 zone (FIG. 10A)

Sheath heater structure: 2-core single terminal type

Minimum bending radius of sheath heater: 8 mm

Material of the heating wire 20: nickel chromium alloy (80% nickel, 20% chromium)

Round wire diameter of heating wire: ϕ0.53 mm

Minimum distance between biaxial heating wires: 0.6 mm

Minimum distance between metal sheath and the heating wires: 0.6 mm

Material of metal sheath: SUS

Inner diameter of metal sheath: 2.54 mm

Thickness of metal sheath: 0.33 mm

Outer diameter of metal sheath 40: 3.2 mm

It should be noted that when the sheath heater which has the same structure as that of Comparative Example 2 (heating wires arranged linearly), the heating wire is made of a nickel chromium alloy, and the metal sheath is made of aluminum, there was a disconnection problem due to the large difference in coefficient of the respective thermal expansion.

[Pattern Layout]

The pattern layouts of the sheath heaters in the heater units of Example 2 and Comparative Example 2 described above were compared. The sheath heaters in the heater units of Example 2 and Comparative Example 2 have a two-core single-terminal structure so that one terminal is extracted from the hollow part of a shaft per one sheath heater. Furthermore, as a result, the hollow part of a shaft can be used effectively and in either case it is possible to arrange two or more sheath heaters in a heater unit. In addition, since the outer diameter of the sheath heater is small, it is possible provide a heater unit with a fine pattern shaped layout. In Example 2 and Comparative Example 2, they were arranged as is shown in FIG. 9A and FIG. 10A.

[Evaluation of Stage Surface Shape after Thermal Cycle Test]

A thermal cycle test was repeated for 500 cycles of a temperature rise and fall from 150° C. to 400° C. using the heater units according to Example 2 and Comparative Example 2. After the heat cycle test, the surface shape of the stage of the heater unit according to Example 2 and Comparative Example 2 was measured using a three-dimensional measuring machine (manufactured by Mitutoyo Corporation). Variations in the height of the stages of the heater units according to Example 2 and Comparative Example 2 are shown in FIG. 9B and FIG. 10B.

As is shown in FIG. 9B, a large difference in height was not observed on the surface of the stage in the heater unit according to Example 2. The flatness level of the surface of the stage was 0.0075. On the other hand, as is shown in FIG. 10B, in the heater unit according to Comparative Example 2, a large difference in height was observed on the surface of the stage and it was significantly increased from the periphery area of the stage toward the central area. The flatness level of the surface of the stage was 0.2048. In Comparative Example 2, since the material of the metal sheath is SUS and the material of the first substrate and the second substrate is aluminum, the difference in the coefficient of thermal expansion is large and the heater unit is believed to be deformed by the thermal cycle test.

[Evaluation of Temperature Distribution at Stage Surface and Surface of the Object to be Heated after Thermal Cycle Test]

The temperature distribution during heating was measured using the heater unit according to Example 2 after the thermal cycle test described above. The setting conditions when heating the heater (360° C.) in Example 2 are as follows.

Amount of heat generated by the sheath heater: 2000 W.

The temperature distribution when heating a heater was measured using the heater unit according to Comparative Example 2 after the thermal cycle test described above. The setting conditions when heating the heater (360° C.) in Comparative Example 2 are as follows.

Amount of heat generated by the sheath heater: 2000 W.

Figure 9D:
FIG. 9D is a diagram showing a temperature distribution of a heater unit of an example.
Figure 9D:
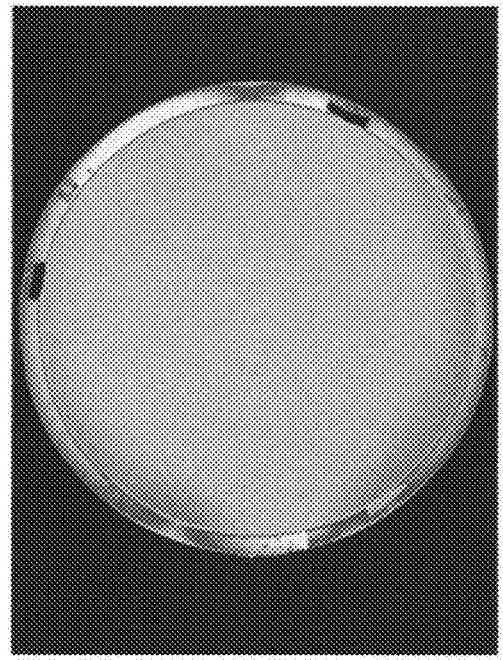
Figure 9C:
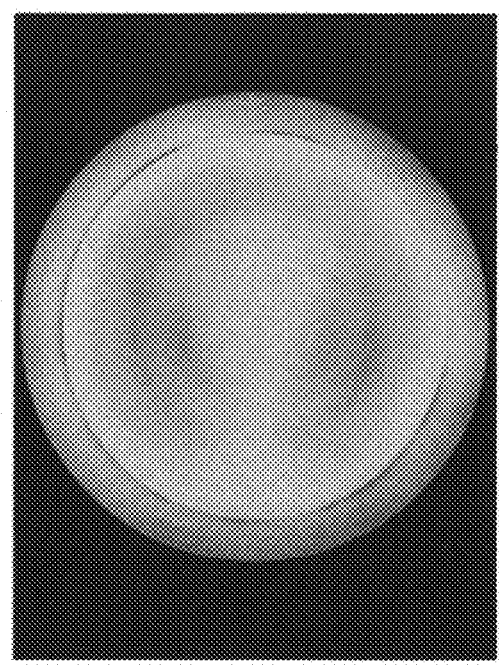
FIG. 9C is a diagram showing a temperature distribution of a heater unit of an example.
Figure 10D:
FIG. 10D is a diagram showing a temperature distribution of a heater unit of a comparative example.
Figure 10D:
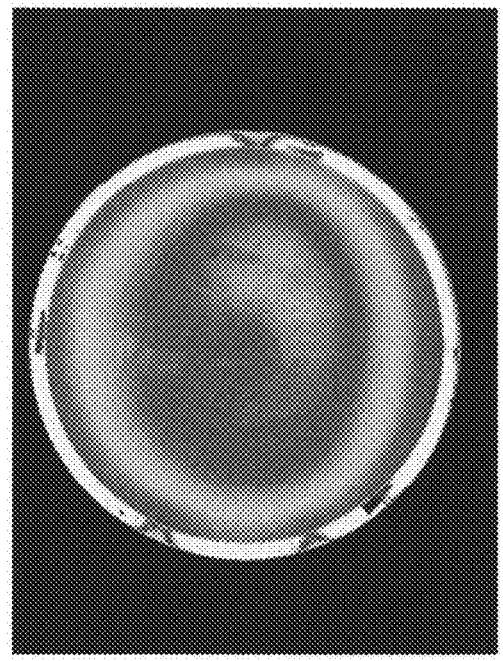
Figure 10C:
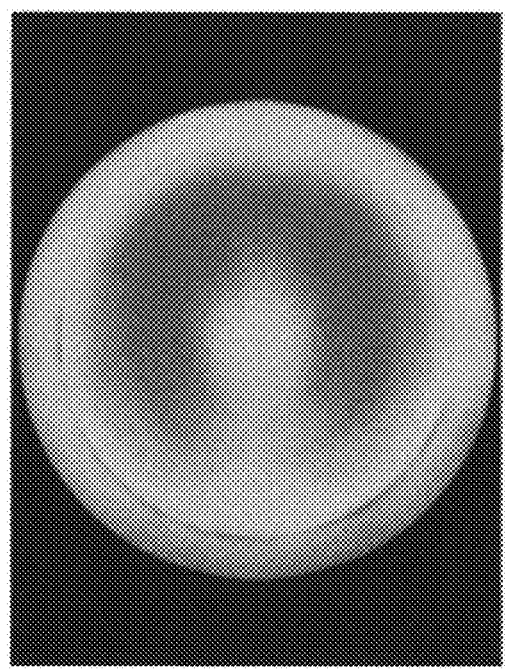
FIG. 10C is a diagram showing a temperature distribution of a heater unit of a comparative example.

The surface temperature of the stage in the heater unit according to Example 2 and Comparative Example 2 when equilibrium was reached under the setting conditions described above was measured using infrared thermography (manufactured by FILR). IR images of the heater units according to Example 2 and Comparative Example 2 are shown in FIG. 9C and FIG. 10C. The surface temperature of an object to be heated (a wafer in this case) on the heater units according to Example 2 and Comparative Example 2 when equilibrium was reached under the same setting conditions was measured using infrared thermography (manufactured by FILR). FIG. 9D and FIG. 10D show IR images of objects to be heated on the heater units according to Example 2 and Comparative Example 2.

As is shown in FIG. 9C and FIG. 9D, a large temperature distribution was not observed on the surface of the stage and the surface of the object to be heated on the heater unit according to Example 2. The maximum temperature difference on the surface of the stage surface was 9.82° C. and the maximum temperature difference on the surface of the object to be heated was 9.51° C. On the other hand, as is shown in FIG. 10C and FIG. 10D, although a large temperature distribution was not observed on the surface of the stage of the heater unit according to Comparative Example 2, a large temperature distribution was observed on the surface of the object to be heated. The temperature increased significantly from the periphery area toward the central area on the surface of the object to be heated. The maximum temperature difference on the surface of the stage was 8.55° C. and the maximum temperature difference on the surface of the object to be heated was 15.53° C. In Comparative Example 2, it is considered that the deformation of the stage on which the object to be heated is mounted significantly affected the temperature distribution of the object to be heated.

From the above results, it was understood that in the heater unit according to Example 2, it is possible to suppress deformation of the stage and perform uniform heating of an object to be heated. Therefore, by using a film forming device or a film processing device apparatus arranged with this heater unit, it is possible to form various thin films which have uniform characteristics on a substrate, or uniformly process a thin film on the substrate and thereby it is possible to control the semiconductor process more precisely.

Each embodiment described above as embodiments of the present invention can be implemented in combination as appropriate as long as they do not contradict each other. In addition, those skilled in the art could appropriately add, delete or change the design of the constituent elements based on the each embodiment, as long as it does not depart from the concept of the present invention and such changes are included within the scope of the present invention.

In addition, even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A heater unit comprising:
   a first substrate having a first joint surface and a second substrate having a second joint surface being joined together;
   a groove arranged on at least one of the first joint surface or the second joint surface; and
   a sheath heater arranged inside the groove;
   wherein the sheath heater comprises,
      a metal sheath,
      a heating wire having a band shape, the heating wire being separated from the metal sheath so as to form a helical structure about an axis parallel to an axial direction of the metal sheath, and being arranged in a double helix structure so as to form a biaxial region in the metal sheath,
      an insulating material arranged between the heating wire and the metal sheath, and
      connection terminals arranged at one end of the metal sheath, the connection terminals electrically connected with both ends of the heating wire respectively, and
   wherein surface directions formed by a width of the biaxial heating wire are substantially parallel, and a rotation direction of each helix of the heating wire is substantially the same and a rotation pitch is substantially the same.

2. The heater unit according to claim 1, wherein a plurality of the sheath heaters is arranged and controlled independently of each other.

3. The heater unit according to claim 1, wherein the groove is arranged on the first joint surface.

4. The heater unit according to claim 1, wherein a material used for the metal sheath, the first substrate and the second substrate has the same coefficient of thermal expansion.

5. The heater unit according to claim 1, wherein a material used for the metal sheath, the first substrate and the second substrate is the same metal material.

6. The heater unit according to claim 1, wherein a metal material used for the metal sheath, the first substrate and the second substrate is aluminum.

7. The heater unit according to claim 1, wherein the first substrate and the second substrate are joined together by soldering.

8. The heater unit according to claim 1, wherein the insulating material is an inorganic insulating powder.

9. The heater unit according to claim 1, wherein the heating wire is a nickel-chrome alloy and the insulating material is magnesium oxide.

10. The heater unit according to claim 1, wherein the rotation axes of each helix of the heating wire are arranged in a state where they substantially match so that the biaxial heating wire is coiled having the double helix structure.

* * * * *